United States Patent
Kawahara et al.

(10) Patent No.: US 11,168,216 B2
(45) Date of Patent: Nov. 9, 2021

(54) RESIN MATERIAL AND LAMINATE

(71) Applicant: SEKISUI CHEMICAL CO., LTD., Osaka (JP)

(72) Inventors: Yuko Kawahara, Tsukuba (JP); Keigo Oowashi, Osaka (JP); Kouji Ashiba, Osaka (JP); Masataka Sugimoto, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 16/480,283

(22) PCT Filed: Jan. 29, 2018

(86) PCT No.: PCT/JP2018/002721
§ 371 (c)(1),
(2) Date: Jul. 23, 2019

(87) PCT Pub. No.: WO2018/139644
PCT Pub. Date: Aug. 2, 2018

(65) Prior Publication Data
US 2020/0032064 A1    Jan. 30, 2020

(30) Foreign Application Priority Data

Jan. 30, 2017 (JP) .............. JP2017-014017

(51) Int. Cl.
| | | |
|---|---|---|
| *C08L 101/00* | (2006.01) | |
| *B32B 27/20* | (2006.01) | |
| *B32B 27/26* | (2006.01) | |
| *C08K 3/38* | (2006.01) | |
| *H01B 3/00* | (2006.01) | |
| *H01B 3/30* | (2006.01) | |
| *H01L 23/373* | (2006.01) | |

(52) U.S. Cl.
CPC ............ *C08L 101/00* (2013.01); *B32B 27/20* (2013.01); *B32B 27/26* (2013.01); *C08K 3/38* (2013.01); *H01B 3/004* (2013.01); *H01B 3/30* (2013.01); *H01L 23/373* (2013.01); *B32B 2250/03* (2013.01); *C08K 2003/385* (2013.01); *C08K 2201/003* (2013.01); *C08K 2201/005* (2013.01); *C08L 2203/20* (2013.01)

(58) Field of Classification Search
CPC .... C08L 101/00; C08L 2203/20; B32B 27/20; B32B 27/26; B32B 27/18; H01B 3/004; H01B 3/30; H01L 23/373; C08K 3/38; C08K 2003/385; C08K 2201/003; C08K 2201/005; C08K 2201/014
See application file for complete search history.

(56) References Cited

U.S. PATENT DOCUMENTS

| | | | |
|---|---|---|---|
| 5,486,941 A | 1/1996 | Saiuchi et al. | |
| 5,615,031 A | 3/1997 | Saiuchi et al. | |
| 2015/0037575 A1 | 2/2015 | Sakaguchi et al. | |
| 2016/0115343 A1 | 4/2016 | Takahara et al. | |
| 2017/0283645 A1 | 10/2017 | Sakaguchi et al. | |
| 2018/0051158 A1* | 2/2018 | Nam ................... | C08K 3/38 |
| 2019/0352486 A1 | 11/2019 | Kawahara et al. | |
| 2020/0385543 A1 | 12/2020 | Kawahara et al. | |

FOREIGN PATENT DOCUMENTS

| | | |
|---|---|---|
| JP | 6-503180 A | 4/1994 |
| JP | 2011-6586 A | 1/2011 |
| JP | 2015-34269 A | 2/2015 |
| JP | 2017-128476 A | 7/2017 |
| JP | 2018-82166 A | 4/2018 |
| WO | WO-2012/070289 A1 | 5/2012 |
| WO | WO-2013/145961 A1 | 10/2013 |
| WO | WO-2014/199650 A1 | 12/2014 |
| WO | WO-2016/092952 A1 | 6/2016 |
| WO | WO-2018/139639 A1 | 8/2018 |
| WO | WO-2018/139640 A1 | 8/2018 |
| WO | WO-2018/139645 A1 | 8/2018 |

OTHER PUBLICATIONS

Database WPI, Week 201240 Thomson Scientific, London, GB; AN 2012-G43831, XP002799309 (and WO 2012/070289 A1).
Supplementary European Search Report for the Application No. EP 18 745 143.0 dated Aug. 5, 2020.
Written Opinion of the International Searching Authority (PCT/ISA/237) for Application No. PCT/JP2018/002721 dated Apr. 17, 2018 (English Translation mailed Aug. 8, 2019).
International Search Report for the Application No. PCT/JP2018/002721 dated Apr. 17, 2018.
Written Opinion of the International Searching Authority (PCT/ISA/237) for Application No. PCT/JP2018/002721 dated Apr. 17, 2018.
Notification of Reasons for Refusal for the Application No. 2018-506237 from Japan Patent Office dated Aug. 17, 2021.

* cited by examiner

*Primary Examiner* — Robert S Jones, Jr.
(74) *Attorney, Agent, or Firm* — Cheng Law Group, PLLC (57) ABSTRACT

Provided is a resin material capable of effectively improving the insulating properties and the thermal conductivity, and effectively controlling the variation in dielectric breakdown strength. A resin material according to the present invention includes first boron nitride aggregate particles, second boron nitride aggregate particles, and a binder resin, and a 10% K value of the second boron nitride aggregate particles is smaller than a 30% K value of the second boron nitride aggregate particles, and a 30% K value of the second boron nitride aggregate particles is smaller than a 10% K value of the first boron nitride aggregate particles.

13 Claims, 2 Drawing Sheets

RESIN MATERIAL AND LAMINATE

TECHNICAL FIELD

The present invention relates to a resin material containing boron nitride aggregate particles, and a binder resin. The present invention also relates to a laminate prepared with the resin material.

BACKGROUND

Recent miniaturization and higher performance of electronic or electric devices have become requiring higher packaging density of electronic components. Therefore, how to release the heat generated from electronic components in a narrow space is a problem. Since the heat generated from electronic components is directly linked to the reliability of the electronic or electric device, efficient radiation of the generated heat is an urgent problem.

One measure for solving the above problem is using a ceramic substrate having high thermal conductivity as a heat radiation substrate on which a power semiconductor device or the like is mounted. Examples of such a ceramic substrate include an alumina substrate and an aluminum nitride substrate.

The above measure using a ceramic substrate, however, has problems of difficulty in forming a multilayer structure, poor workability, and very high cost. Further, since the difference in coefficient of linear expansion between the ceramic substrate and a copper circuit is large, there is also a problem that the copper circuit is easy to peel off during the cooling-heating cycle.

Given this situation, a resin composition containing boron nitride having a low coefficient of linear expansion, in particular, hexagonal boron nitride receives attention as a heat radiation material. The crystal structure of hexagonal boron nitride is a hexagonally-meshed laminar structure as with graphite, and the particle shape of hexagonal boron nitride is scaly. Therefore, it is known that in hexagonal boron nitride, the coefficient of thermal conductivity in the planar direction is higher than the coefficient of thermal conductivity in the thickness direction, and the coefficient of thermal conductivity has anisotropy.

As a method for reducing the anisotropy in the coefficient of thermal conductivity of hexagonal boron nitride, and improving the coefficient of thermal conductivity in the thickness direction, use of secondary aggregate particles in which primary particles of hexagonal boron nitride are aggregated (boron nitride aggregate particles) has been proposed. The following Patent Documents 1 to 3 disclose a resin composition containing boron nitride aggregate particles.

The following Patent Document 1 discloses a thermosetting resin composition containing an inorganic filler in a thermosetting resin. The inorganic filler contains a secondary aggregate (A) composed of primary particles of boron nitride having a mean major axis of 8 or less, and a secondary aggregate (B) composed of primary particles of boron nitride having a mean major axis of more than 8 μm and 20 μm or less in a volume ratio of 40:60 to 98:2. The content of the inorganic filler is 40 vol % or more and 80 vol % or less.

The following Patent Document 2 discloses a curable heat radiation composition containing two fillers having different compression breaking strengths (excluding the case where the two fillers are of the same substance), and a curable resin (C). The ratio of compression breaking strengths of the two fillers (the ratio of compression breaking strength of a filler (A) having a larger compression breaking strength to compression breaking strength of a filler (B) having a smaller compression breaking strength) is 5 or more and 1500 or less. The filler (B) comprises hexagonal boron nitride aggregate particles.

The following Patent Document 3 discloses a thermosetting resin composition containing a thermosetting resin and an inorganic filler. The inorganic filler contains secondary particles (A) formed of primary particles of boron nitride having an aspect ratio of 10 or more and 20 or less, and secondary particles (B) formed of primary particles of boron nitride having an aspect ratio of 2 or more and 9 or less.

RELATED ART DOCUMENTS

Patent Documents

Patent Document 1: JP 2011-6586 A
Patent Document 2: WO2013/145961A1
Patent Document 3: WO2014/199650A1

SUMMARY OF THE INVENTION

Problems to be Solved by the Invention

In conventional curable compositions containing boron nitride aggregate particles as described in Patent Documents 1 to 3, it is necessary not to, for example, collapse the boron nitride aggregate particles by pressing at the time of pressing such as sheet forming so as to keep the isotropy of the coefficient of thermal conductivity of the boron nitride aggregate particles. Therefore, voids sometimes remain between boron nitride aggregate particles. Although this results in improvement in heat conductivity in the thickness direction, the insulating properties can deteriorate.

Further, if pressing such as sheet forming is conducted to remove the voids between boron nitride aggregate particles, the boron nitride aggregate particles deform or collapse, and the isotropy of the thermal conductivity of the boron nitride aggregate particles can be lost. This can result in deterioration in coefficient of thermal conductivity in the pressing direction (thickness direction). In conventional boron nitride aggregate particles, there is a limit to achieve both high insulating properties and high thermal conductivity.

In addition, in conventional curable compositions containing boron nitride aggregate particles, it is difficult to completely eliminate voids between boron nitride aggregate particles, and variation in dielectric breakdown strength can arise.

It is an object of the present invention to provide a resin material capable of effectively improving the insulating properties and the thermal conductivity and further effectively controlling the variation in dielectric breakdown strength, and a laminate prepared with the resin material.

Means for Solving the Problems

According to a broad aspect of the present invention, there is provided a resin material including first boron nitride aggregate particles, second boron nitride aggregate particles, and a binder resin, a 10% K value of the second boron nitride aggregate particles being smaller than a 30% K value of the second boron nitride aggregate particles, the 30% K value of the second boron nitride aggregate particles being smaller than a 10% K value of the first boron nitride aggregate particles.

In a specific aspect of the resin material according to the present invention, a 30% K value of the first boron nitride aggregate particles is smaller than the 10% K value of the first boron nitride aggregate particles.

In a specific aspect of the resin material according to the present invention, the 10% K value of the first boron nitride aggregate particles is 50 N/mm$^2$ or more.

In a specific aspect of the resin material according to the present invention, primary particles constituting the second boron nitride aggregate particles have an aspect ratio of 9 or less.

In a specific aspect of the resin material according to the present invention, the first boron nitride aggregate particles have a particle diameter of more than 20 μm, primary particles constituting the first boron nitride aggregate particles have a mean major axis of 2 μm or more and less than 20 μm, and primary particles constituting the second boron nitride aggregate particles have a mean major axis of 8 μm or less.

In a specific aspect of the resin material according to the present invention, the second boron nitride aggregate particles have a particle diameter of 30 μm or more and 60 μm or less.

In a specific aspect of the resin material according to the present invention, a total content of the first boron nitride aggregate particles and the second boron nitride aggregate particles in 100 vol % of the resin material is 20 vol % or more and 80 vol % or less.

According to a specific aspect of the resin material of the present invention, the resin material is a resin sheet.

According to a broad aspect of the present invention, there is provided a laminate including a heat conductor, an insulating layer stacked on one face of the heat conductor, and a conductive layer stacked on a face opposite to the heat conductor of the insulating layer, the insulating layer being formed of the resin material.

Effect of the Invention

The resin material according to the present invention includes first boron nitride aggregate particles, second boron nitride aggregate particles, and a binder resin. In the resin material according to the present invention, the 10% K value of the second boron nitride aggregate particles is smaller than the 30% K value of the second boron nitride aggregate particles. In the resin material according to the present invention, the 30% K value of the second boron nitride aggregate particles is smaller than the 10% K value of the first boron nitride aggregate particles. In the resin material according to the present invention, since the aforementioned configuration is provided, it is possible to effectively improve the insulating properties and the thermal conductivity, and further it is possible to effectively control the variation in dielectric breakdown strength.

MODE(S) FOR CARRYING OUT THE INVENTION

Hereinafter, the present invention will be described in detail.

(Resin Material)

The resin material according to the present invention includes first boron nitride aggregate particles, second boron nitride aggregate particles, and a binder resin.

In the resin material according to the present invention, the 10% K value of the second boron nitride aggregate particles is smaller than the 30% K value of the second boron nitride aggregate particles. In the resin material according to the present invention, the 30% K value of the second boron nitride aggregate particles is smaller than the 10% K value of the first boron nitride aggregate particles. A K value of boron nitride aggregate particles indicates hardness of the boron nitride aggregate particles when the boron nitride aggregate particles collapse at a specific rate. The K value is an index for evaluating the change in hardness of the boron nitride aggregate particles in association with collapse of the boron nitride aggregate particles. By using the K value, the collapse behavior of the boron nitride aggregate particles can be expressed in detail.

In the resin material according to the present invention, since the aforementioned configuration is provided, it is possible to effectively improve the insulating properties and the thermal conductivity, and further it is possible to effectively control the variation in dielectric breakdown strength.

In the resin material according to the present invention, when a compressive force is applied by pressing or the like, the first boron nitride aggregate particles do not deform or collapse excessively, and the second boron nitride aggregate particles deform or collapse moderately in the early stage of compression. Therefore, the second boron nitride aggregate particles existing between the first boron nitride aggregate particles collapse stepwise, so that voids existing between the first boron nitride aggregate particles can be filled, and the insulating properties can be effectively improved. Further, since the moderately deformed or collapsed second boron nitride aggregate particles are densely located around the first boron nitride aggregate particles, it is considered that the hardness of the second boron nitride aggregate particles that are densely located as a result of collapse increases, and the second boron nitride aggregate particles are capable of functioning as a frame that supports the first boron nitride aggregate particles. As a result, the first boron nitride aggregate particles do not deform or collapse excessively, and are capable of keeping the shapes of the aggregate particles, so that the thermal conductivity can be effectively improved.

The first boron nitride aggregate particles are relatively difficult to deform or collapse compared with the second boron nitride aggregate particles. The second boron nitride aggregate particles are relatively easy to deform or collapse compared with the first boron nitride aggregate particles. Therefore, when a compressive force is applied by pressing or the like, the first boron nitride aggregate particles do not deform or collapse excessively, and the second boron nitride aggregate particles deform or collapse moderately. It is preferred that a pressing pressure at which deformation or collapse of the second boron nitride aggregate particles occurs is lower than a pressing pressure at which deformation or collapse of the first boron nitride aggregate particles occurs.

For example, when pressing is conducted at sheet forming or the like using a resin material containing only the first boron nitride aggregate particles, the first boron nitride aggregate particles are difficult to deform or collapse by pressing, so that the thermal conductivity in the planar direction and the thickness direction can be improved. However, voids remain between the first boron nitride aggregate particles, so that the insulating properties are impaired. On the other hand, when pressing is conducted to such an extent that voids are cleared, even the first boron nitride aggregate particles cannot keep their forms, so that the thermal conductivity in the thickness direction deteriorates. When pressing is conducted at sheet forming or the like using a resin material containing only the second boron nitride aggregate particles, the second boron nitride aggregate particles are easy to deform or collapse by pressing, so that the thermal conductivity in the thickness direction can deteriorate.

In the resin material according to the present invention, the 10% K value (hardness) of the first boron nitride aggregate particles is higher than the 10% K value (hardness) of the second boron nitride aggregate particles. The 10% K value (hardness) of the second boron nitride aggregate particles is lower than the 10% K value (hardness) of the first boron nitride aggregate particles. Therefore, when a compressive force is applied by pressing or the like, the first boron nitride aggregate particles do not deform or collapse excessively, and the second boron nitride aggregate particles deform or collapse moderately in the early stage of compression. When compression is made to such an extent that the first boron nitride aggregate particles deform, the second boron nitride aggregate particles deform of collapse around the first boron nitride aggregate particles. As a result, the second boron nitride aggregate particles are densely located around the first boron nitride aggregate particles, so that the apparent hardness improves. Therefore, it is possible to suppress deformation or collapse of the first boron nitride aggregate particles, and it is possible to improve the thermal conductivity in the planar direction and the thickness direction. Also, the compressed second boron nitride aggregate particles are capable of filling voids existing between the first boron nitride aggregate particles, so that the insulating properties can be effectively improved. The moderately deformed or collapsed second boron nitride aggregate particles are densely located around the first boron nitride aggregate particles. By the densely located second boron nitride aggregate particles, the compressive force is applied to the first boron nitride aggregate particles not only in the thickness (pressing) direction but also in the planar direction, so that the (spherical) shape of the aggregate particles can be kept, and the thermal conductivity can be improved effectively.

In the resin material according to the present invention, since the second boron nitride aggregate particles are relatively fragile, compressed second boron nitride aggregate particles and primary particles constituting the second boron nitride aggregate particles are capable of filling voids existing between the first boron nitride aggregate particles without any clearance. As a result, it is possible to suppress partial discharge (internal discharge) occurring inside void parts, and it is possible to effectively control the variation in dielectric breakdown strength such as dielectric breakdown strength. Also, it is possible to improve the long-term reliability.

Using the first boron nitride aggregate particles and the second boron nitride aggregate particles that satisfy the specific relationship in K value greatly contributes to obtaining the effect as described above.

(First Boron Nitride Aggregate Particles and Second Boron Nitride Aggregate Particles)

In the resin material according to the present invention, the 10% K value of the second boron nitride aggregate particles is smaller than the 30% K value of the second boron nitride aggregate particles. In the resin material according to the present invention, the 30% K value of the second boron nitride aggregate particles is smaller than the 10% K value of the first boron nitride aggregate particles.

From the viewpoint of improving the insulating properties and the thermal conductivity more effectively, and from the viewpoint of controlling the variation in dielectric breakdown strength more effectively, it is preferred that the 30% K value of the first boron nitride aggregate particles is smaller than the 10% K value of the first boron nitride aggregate particles.

From the viewpoint of improving the insulating properties more effectively, and from the viewpoint of controlling the variation in dielectric breakdown strength more effectively, it is preferred that the 30% K value of the second boron nitride aggregate particles is smaller than the 30% K value of the first boron nitride aggregate particles.

From the viewpoint of improving the insulating properties and the thermal conductivity more effectively, and from the viewpoint of controlling the variation in dielectric breakdown strength more effectively, it is preferred that a 20% K value of the second boron nitride aggregate particles is smaller than a 20% K value of the first boron nitride aggregate particles.

From the viewpoint of improving the insulating properties and the thermal conductivity more effectively, and from the viewpoint of controlling the variation in dielectric breakdown strength more effectively, it is preferred that the 10% K value of the second boron nitride aggregate particles is smaller than the 20% K value of the second boron nitride aggregate particles. From the viewpoint of improving the insulating properties and the thermal conductivity more effectively, and from the viewpoint of controlling the variation in dielectric breakdown strength more effectively, it is preferred that the 20% K value of the second boron nitride aggregate particles is smaller than the 30% K value of the second boron nitride aggregate particles.

From the viewpoint of improving the insulating properties and the thermal conductivity more effectively, and from the viewpoint of controlling the variation in dielectric breakdown strength more effectively, the 10% K value of the first boron nitride aggregate particles is preferably 50 $N/mm^2$ or more, more preferably 60 $N/mm^2$ or more. The upper limit of the 10% K value of the first boron nitride aggregate particles is not particularly limited. The 10% K value of the first boron nitride aggregate particles may be 500 $N/mm^2$ or less.

From the viewpoint of improving the insulating properties and the thermal conductivity more effectively, and from the viewpoint of controlling the variation in dielectric breakdown strength more effectively, the 10% K value of the second boron nitride aggregate particles is preferably 50 $N/mm^2$ or less, more preferably 30 $N/mm^2$ or less. The lower limit of the 10% K value of the second boron nitride aggregate particles is not particularly limited. The 10% K value of the second boron nitride aggregate particles may be 5 $N/mm^2$ or more.

An absolute value of difference between the 10% K value of the first boron nitride aggregate particles, and the 10% K value of the second boron nitride aggregate particles is preferably 50 $N/mm^2$ or more, more preferably 65 $N/mm^2$ or more, and preferably 400 $N/mm^2$ or less, more preferably 300 $N/mm^2$ or less. When the absolute value of difference between the 10% K value of the first boron nitride aggregate particles, and the 10% K value of the second boron nitride aggregate particles is in the range from the lower limit to the upper limit, it is possible to improve the insulating properties and the thermal conductivity more effectively, and to control the variation in dielectric breakdown strength more effectively.

An absolute value of difference between the 20% K value of the first boron nitride aggregate particles, and the 20% K value of the second boron nitride aggregate particles is preferably 1 N/mm² or more, more preferably 3 N/mm² or more, and preferably 200 N/mm² or less, more preferably 100 N/mm² or less. When the absolute value of difference between the 20% K value of the first boron nitride aggregate particles, and the 20% K value of the second boron nitride aggregate particles is in the range from the lower limit to the upper limit, it is possible to improve the insulating properties and the thermal conductivity more effectively, and to control the variation in dielectric breakdown strength more effectively.

From the viewpoint of improving the insulating properties and the thermal conductivity more effectively, and from the viewpoint of controlling the variation in dielectric breakdown strength more effectively, a ratio of the 20% K value of the first boron nitride aggregate particles to the 10% K value of the first boron nitride aggregate particles is preferably 0.3 or more, more preferably 0.4 or more, and preferably 0.9 or less, more preferably 0.7 or less.

From the viewpoint of improving the insulating properties and the thermal conductivity more effectively, and from the viewpoint of controlling the variation in dielectric breakdown strength more effectively, a ratio of the 30% K value of the first boron nitride aggregate particles to the 10% K value of the first boron nitride aggregate particles is preferably 0.2 or more, more preferably 0.25 or more, and preferably 0.7 or less, more preferably 0.6 or less.

From the viewpoint of improving the insulating properties and the thermal conductivity more effectively, and from the viewpoint of controlling the variation in dielectric breakdown strength more effectively, a ratio of the 20% K value of the second boron nitride aggregate particles to the 10% K value of the second boron nitride aggregate particles is preferably 1 or more, more preferably 1.5 or more, and preferably 5 or less, more preferably 3 or less.

From the viewpoint of improving the insulating properties and the thermal conductivity more effectively, and from the viewpoint of controlling the variation in dielectric breakdown strength more effectively, a ratio of the 30% K value of the second boron nitride aggregate particles to the 10% K value of the second boron nitride aggregate particles is preferably 1.5 or more, more preferably 2 or more, and preferably 6 or less, more preferably 4 or less.

A compression modulus of elasticity (10% K value, 20% K value, and 30% K value) of the first boron nitride aggregate particles and the second boron nitride aggregate particles can be determined in the following manner.

One boron nitride aggregate particle is compressed with a smooth indenter end face of a prism (made of diamond) using a micro compression tester in the conditions of 25° C., a compressing speed of 0.67 mN/second, and a maximum test load of 120 mN for the first boron nitride aggregate particles, and 80 mN for the second boron nitride aggregate particles. A load value (N) and a compressive deformation amount (mm) at this time are measured. From the obtained measurements, the compression modulus of elasticity (10% K value, 20% K value, and 30% K value) can be determined according to the following formula. The compression modulus of elasticity (10% K value, 20% K value, and 30% K value) means a mean value obtained by averaging results of at least 10 times of measurement. As the micro compression tester, for example, "Micro compression tester HM2000" available from Fischer Instruments or the like is used. The compressibility can be calculated by (compressibility=compressive displacement mean particle diameter×100).

A K value is calculated for each compressibility.

10% K value, 20% K value, or 30% K value $(N/mm^2)=3\cdot10^3\cdot F/(D^2\cdot X^{3/2})$ F: Load value (N) when the first or second boron nitride aggregate particles compressively deform by 10%, 20%, or 30%

D: Diameter (mm) of the first or second boron nitride aggregate particles

X: Compressibility (%) of the first or second boron nitride aggregate particles

Compressibility of the first or second boron nitride aggregate particles X (%)=100·S/D S: Amount of compressive deformation (mm)

The compression modulus of elasticity generally and quantitatively expresses the hardness of the boron nitride aggregate particles. Use of the compression modulus of elasticity makes it possible to express the hardness of the boron nitride aggregate particles quantitatively and univocally.

The compression modulus of elasticity (10% K value, 20% K value, and 30% K value) may be determined by using boron nitride aggregate particles before being compounded in the resin material, or determined by using boron nitride aggregate particles that are collected by removal of the binder resin from the resin material. One example of a method for removing the binder resin from the resin material is a method of heating the resin material at a high temperature of 600° C. for 5 hours. The method for removing the binder resin from the resin material may be the above method or other method. As other method, if the resin material is of a B stage, boron nitride aggregate particles can be collected by dissolving the binder resin in a solvent such as methylethylketone, followed by filtration and drying. This is merely one example, and the method is not necessarily limited to this method.

From the viewpoint of improving the insulating properties more effectively, and from the viewpoint of improving the thermal conductivity more effectively, the particle diameter of the first boron nitride aggregate particles is preferably more than 20 μm, more preferably 50 μm or more, and preferably 120 μm or less, more preferably 100 μm or less.

From the viewpoint of improving the insulating properties more effectively, and from the viewpoint of improving the thermal conductivity more effectively, the particle diameter of the second boron nitride aggregate particles is preferably 30 μm or more, more preferably 35 μm or more, and preferably 60 μm or less, more preferably 55 μm or less.

The particle diameter of the first boron nitride aggregate particles and the second boron nitride aggregate particles is preferably a mean particle diameter obtained by averaging the volume-based particle diameters. A particle diameter of the first boron nitride aggregate particles and the second boron nitride aggregate particles can be measured by using a "Laser diffraction type particle size distribution measuring device" available from HORIBA, Ltd. A particle diameter of the first boron nitride aggregate particles and the second boron nitride aggregate particles is preferably calculated by sampling 3 g of each kind of boron nitride aggregate particles, and averaging the particle diameters of the boron nitride aggregate particles contained therein. Regarding the method for calculating a mean particle diameter, it is preferred to adopt a particle diameter of the boron nitride aggregate particles at a cumulative volume of 50% (d50) as a mean particle diameter in each of the first boron nitride aggregate particles and the second boron nitride aggregate particles.

From the viewpoint of improving the insulating properties more effectively, and from the viewpoint of improving the thermal conductivity more effectively, the aspect ratio of the first boron nitride aggregate particles is preferably 3 or less, more preferably 2 or less. The lower limit of the aspect ratio of the first boron nitride aggregate particles is not particularly limited. The aspect ratio of the first boron nitride aggregate particles may be 1 or more.

From the viewpoint of improving the insulating properties more effectively, and from the viewpoint of improving the thermal conductivity more effectively, the aspect ratio of the second boron nitride aggregate particles is preferably 3 or less, more preferably 2 or less. The lower limit of the aspect ratio of the second boron nitride aggregate particles is not particularly limited. The aspect ratio of the second boron nitride aggregate particles may be 1 or more.

An aspect ratio of the first boron nitride aggregate particles and the second boron nitride aggregate particles indicates a major axis/minor axis. An aspect ratio of the first boron nitride aggregate particles and the second boron nitride aggregate particles is preferably a mean aspect ratio obtained by averaging aspect ratios of a plurality of boron nitride aggregate particles of each kind. A mean aspect ratio of the first boron nitride aggregate particles and the second boron nitride aggregate particles is determined by observing randomly selected 50 boron nitride aggregate particles of each kind under an electron microscope or an optical microscope, and calculating a mean value of major axis/minor axis of the boron nitride aggregate particles of each kind.

From the viewpoint of improving the thermal conductivity more effectively, the coefficient of thermal conductivity of the first boron nitride aggregate particles is preferably 5 W/m·K or more, more preferably 10 W/m·K or more. The upper limit of the coefficient of thermal conductivity of the first boron nitride aggregate particles is not particularly limited. The coefficient of thermal conductivity of the first boron nitride aggregate particles may be 1000 W/m·K or less.

From the viewpoint of improving the thermal conductivity more effectively, the coefficient of thermal conductivity of the second boron nitride aggregate particles is preferably 5 W/m·K or more, more preferably 10 W/m·K or more. The upper limit of the coefficient of thermal conductivity of the second boron nitride aggregate particles is not particularly limited. The coefficient of thermal conductivity of the second boron nitride aggregate particles may be 1000 W/m·K or less.

From the viewpoint of improving the insulating properties more effectively, and from the viewpoint of improving the thermal conductivity more effectively, a total content of the first boron nitride aggregate particles and the second boron nitride aggregate particles in 100 vol % of the resin material is preferably 20 vol % or more, more preferably 45 vol % or more, and preferably 80 vol % or less, more preferably 70 vol % or less.

A method for producing the first boron nitride aggregate particles and the second boron nitride aggregate particles is not particularly limited, and, for example, a spray drying method and a fluidized bed granulation method can be recited. It is preferred that the method for producing the first boron nitride aggregate particles and the second boron nitride aggregate particles is a spray drying method. The spray drying method can be classified into a two-fluid nozzle system, a disc system (also called a rotary method), and an ultrasonic nozzle system depending on the spraying system, and any of these systems can be applied. The ultrasonic nozzle system is preferred from the viewpoint that the total pore volume can be controlled more easily.

It is preferred that the first boron nitride aggregate particles and the second boron nitride aggregate particles are produced by using primary particles of boron nitride as a material. Boron nitride that is a material for the first boron nitride aggregate particles and the second boron nitride aggregate particles is not particularly limited. Examples of boron nitride that is to be the material include hexagonal boron nitride, cubic boron nitride, boron nitride prepared by reduction nitridation of a boron compound and ammonia, boron nitride prepared from a boron compound and a nitrogen-containing compound such as melamine, and boron nitride prepared from sodium borohydride and ammonium chloride. From the viewpoint of improving the thermal conductivity of the first boron nitride aggregate particles and the second boron nitride aggregate particles more effectively, it is preferred that boron nitride that is to be a material for boron nitride aggregate particles is hexagonal boron nitride.

From the viewpoint of improving the insulating properties more effectively, and from the viewpoint of improving the thermal conductivity more effectively, it is preferred that the first boron nitride aggregate particles are aggregates of first boron nitride which are primary particles, and it is preferred that the second boron nitride aggregate particles are aggregates of second boron nitride which are primary particles. It is preferred that the first boron nitride aggregate particles are secondary particles prepared by aggregation of the first boron nitride which are primary particles, and it is preferred that the second boron nitride aggregate particles are secondary particles prepared by aggregation of the second boron nitride which are primary particles.

As the method for producing boron nitride aggregate particles, the granulation step is not necessarily required. The boron nitride aggregate particles may be formed by natural aggregation of primary particles of boron nitride in association with the growth of crystals of boron nitride. For uniformizing the particle diameters of the boron nitride aggregate particles, the boron nitride aggregate particles may be ground boron nitride aggregate particles.

From the viewpoint of improving the insulating properties more effectively, and from the viewpoint of improving the thermal conductivity more effectively, the first boron nitride aggregate particles may comprise two or more kinds of aggregate particles having the compression modulus of elasticity (10% K value, 20% K value, and 30% K value) within the aforementioned ranges and having different particle diameters. From the viewpoint of improving the insulating properties more effectively, and from the viewpoint of improving the thermal conductivity more effectively, the second boron nitride aggregate particles may comprise two or more kinds of aggregate particles having the compression modulus of elasticity (10% K value, 20% K value, and 30% K value) within the aforementioned ranges and having different particle diameters.

From the viewpoint of improving the insulating properties more effectively, and from the viewpoint of improving the thermal conductivity more effectively, the resin material may contain third inorganic particles that are neither the first boron nitride aggregate particles nor the second boron nitride aggregate particles, besides the first boron nitride aggregate particles and the second boron nitride aggregate particles. From the viewpoint of improving the insulating properties more effectively, and from the viewpoint of improving the thermal conductivity more effectively, it is preferred that the resin material contains the third inorganic particles.

It is preferred that the third inorganic particles are aggregate particles. It is preferred that the third inorganic particles are secondary particles prepared by aggregation of primary particles of boron nitride.

Primary Particles Constituting the First Boron Nitride Aggregate Particles and the Second Boron Nitride Aggregate Particles (First Boron Nitride and Second Boron Nitride):

From the viewpoint of improving the insulating properties and the thermal conductivity more effectively, and from the viewpoint of controlling the variation in dielectric breakdown strength more effectively, a mean major axis of primary particles constituting the first boron nitride aggregate particles (first boron nitride) is preferably 2 µm or more, more preferably 3 µm or more, and preferably less than 20 µm, more preferably 16 µm or less.

From the viewpoint of improving the insulating properties and the thermal conductivity more effectively, and from the viewpoint of controlling the variation in dielectric breakdown strength more effectively, a mean major axis of primary particles constituting the second boron nitride aggregate particles (second boron nitride) is preferably 3 µm or more, more preferably 4 µm or more, and preferably 8 µm or less, more preferably 7.5 µm or less.

A mean major axis of primary particles constituting the first boron nitride aggregate particles and the second boron nitride aggregate particles (first boron nitride and second boron nitride) can be calculated in the following manner.

A cross section of a sheet prepared by mixing primary particles constituting the first boron nitride aggregate particles and the second boron nitride aggregate particles (first boron nitride and second boron nitride) and a thermosetting resin or the like, or a laminate prepared by pressing is observed under an electron microscope. In the obtained electron microscopic image, randomly selected 50 primary particles constituting the boron nitride aggregate particles of each kind (each boron nitride) are determined for a major axis, and a mean value is calculated.

From the viewpoint of improving the insulating properties and the thermal conductivity more effectively, and from the viewpoint of controlling the variation in dielectric breakdown strength more effectively, an aspect ratio of primary particles constituting the first boron nitride aggregate particles (first boron nitride) is preferably 2 or more, more preferably 4 or more, and preferably 20 or less, more preferably 16 or less.

From the viewpoint of improving the insulating properties and the thermal conductivity more effectively, and from the viewpoint of controlling the variation in dielectric breakdown strength more effectively, an aspect ratio of primary particles constituting the second boron nitride aggregate particles (first boron nitride) is preferably 2 or more, more preferably 4 or more, and preferably 9 or less, more preferably 8 or less.

An aspect ratio of primary particles constituting the first boron nitride aggregate particles and the second boron nitride aggregate particles (first boron nitride and second boron nitride) indicates a major axis/minor axis. An aspect ratio of primary particles constituting the first boron nitride aggregate particles and the second boron nitride aggregate particles (first boron nitride and second boron nitride) can be calculated in the following manner.

A cross section of a sheet prepared by mixing primary particles constituting the first boron nitride aggregate particles and the second boron nitride aggregate particles (first boron nitride and second boron nitride) and a thermosetting resin or the like, or a laminate prepared by pressing is observed under an electron microscope. In the obtained electron microscopic image, randomly selected 50 primary particles constituting the boron nitride aggregate particles of each kind (each boron nitride) are measured for a major axis/minor axis, and a mean value is calculated.

In primary particles constituting the first boron nitride aggregate particles and the second boron nitride aggregate particles, not all of the primary particles are required to be scaly but a particle in which a plurality of primary particles are bound or aggregated may be included. The particle in which a plurality primary particles are bound or aggregated may have a bent shape (bent particle), and primary particles constituting the first boron nitride aggregate particles and the second boron nitride aggregate particles may include the bent particle. In particular, when primary particles constituting the second boron nitride aggregate particles include the bent particle in the second boron nitride aggregate particles, the second boron nitride aggregate particles are sometimes capable of filling voids existing between the first boron nitride aggregate particles without any clearance. For a particle in a bent form, the particle is divided into two particles at the bent site, and a major axis/minor axis is measured for each particle, and a major axis/minor axis of the particle having a longer major axis is regarded as a major axis/minor axis of the particle in a bent form. From the obtained value of major axis/minor axis, an aspect ratio is calculated.

In the electron microscopic image of the cross section of the sheet or the laminate, the first boron nitride aggregate particles relatively keep the forms of the aggregate particles even after pressing. Therefore, the first boron nitride aggregate particles can be observed in the electron microscopic image of the cross section of the sheet or the laminate. On the other hand, the second boron nitride aggregate particles deform or collapse while keeping the isotropy even after pressing, so that existence thereof is strongly suggested. Assuming that a sheet or a laminate is prepared by mixing scales obtained by previously crushing the second boron nitride aggregate particles (primary particles constituting the second boron nitride aggregate particles: the above second boron nitride), the first boron nitride aggregate particles, a thermosetting resin and so on, the scales are relatively easy to align in the planar direction compared with the aggregate particles. Therefore, in comparison with the case where the aggregate particles are used, it is difficult for the scales to keep the isotropy even after pressing. Thus, use of both the first boron nitride aggregate particles having a large specific surface area of which shapes are relatively easy to be kept, and the second boron nitride aggregate particles having a small specific surface area and being easy to collapse due to large porosity can be determined from the electron microscopic image of the cross section of the sheet or the laminate even after pressing.

(Binder Resin)

The resin material according to the present invention includes a binder resin. The binder resin is not particularly limited. As the binder resin, a known insulating resin is used. The binder resin preferably contains a thermoplastic component (thermoplastic compound) or a curable component, more preferably contains a curable component. Examples of the curable component include a heat-curable component and a photo-curable component. It is preferred that the heat-curable component contains a heat-curable compound and a heat curing agent. It is preferred that the photo-curable component contains a photo-curable compound and a photopolymerization initiator. It is preferred that the binder resin contains a heat-curable component. Only one kind of the binder resin may be used, and two or more kinds thereof may be used in combination.

"(Meth)acryloyl group" indicates an acryloyl group and a methacryloyl group. "(Meth)acryl" indicates acryl and methacryl. "(Meth)acrylate" indicates acrylate and methacrylate.

(Heat-Curable Component: Heat-Curable Compound)

Examples of the heat-curable compound include a styrene compound, a phenoxy compound, an oxetane compound, an epoxy compound, an episulfide compound, a (meth)acryl compound, a phenol compound, an amino compound, an unsaturated polyester compound, a polyurethane compound, a silicone compound and a polyimide compound. Only one kind of the heat-curable compound may be used, and two or more kinds thereof may be used in combination.

As the heat-curable compound, (A1) heat-curable compound having a molecular weight of less than 10000 (sometimes simply referred to as (A1) heat-curable compound), or (A2) heat-curable compound having a molecular weight of 10000 or more (sometimes simply referred to as (A2) heat-curable compound) may be used. As the heat-curable compound, both (A1) heat-curable compound and (A2) heat-curable compound may be used.

In 100 vol % of the resin material, the content of the heat-curable compound is preferably 10 vol % or more, more preferably 20 vol % or more, and preferably 90 vol % or less, more preferably 80 vol % or less. When the content of the heat-curable compound is equal to the aforementioned lower limit or more, adhesion and heat resistance of the cured product further increase. When the content of the heat-curable compound is equal to the aforementioned upper limit or less, the coating performance of the resin material further increases.

(A1) Heat-Curable Compound Having a Molecular Weight of Less than 10000:

Examples of (A1) heat-curable compound include a heat-curable compound having a cyclic ether group. Examples of the cyclic ether group include an epoxy group and an oxetanyl group. It is preferred that the heat-curable compound having a cyclic ether group is a heat-curable compound having an epoxy group or an oxetanyl group. Only one kind of (A1) heat-curable compound may be used, and two or more kinds thereof may be used in combination.

(A1) Heat-curable compound may include (A1a) heat-curable compound having an epoxy group (sometimes simply referred to as (A1a) heat-curable compound), or include (A1b) heat-curable compound having an oxetanyl group (sometimes simply referred to as (A1b) heat-curable compound).

From the viewpoint of increasing the heat resistance and moisture resistance of the cured product more effectively, it is preferred that (A1) heat-curable compound has an aromatic backbone.

Examples of the aromatic backbone include, but are not particularly limited to, a naphthalene backbone, a fluorene backbone, a biphenyl backbone, an anthracene backbone, a pyrene backbone, a xanthene backbone, an adamantane backbone, and a bisphenol A backbone. From the viewpoint of increasing the cooling-heating cycle resistance and the heat resistance of the cured product more effectively, it is preferred that the aromatic backbone is a biphenyl backbone or a fluorene backbone.

Examples of (A1a) heat-curable compound include an epoxy monomer having a bisphenol backbone, an epoxy monomer having a dicyclopentadiene backbone, an epoxy monomer having a naphthalene backbone, an epoxy monomer having an adamantane backbone, an epoxy monomer having a fluorene backbone, an epoxy monomer having a biphenyl backbone, an epoxy monomer having a bi(glycidyloxyphenyl) methane backbone, an epoxy monomer having a xanthene backbone, an epoxy monomer having an anthracene backbone, and an epoxy monomer having a pyrene backbone. A hydrogenated product or a modified product of these compounds may be used. Only one kind of (A1a) heat-curable compound may be used, and two or more kinds thereof may be used in combination.

Examples of the epoxy monomer having a bisphenol backbone include epoxy monomers having a bisphenol backbone of bisphenol A type, bisphenol F type or bisphenol S type.

Examples of the epoxy monomer having a dicyclopentadiene backbone include dicyclopentadiene dioxide, and a phenol novolak epoxy monomer having a dicyclopentadiene backbone.

Examples of the epoxy monomer having a naphthalene backbone include 1-glycidyl naphthalene, 2-glycidyl naphthalene, 1,2-diglycidyl naphthalene, 1,5-diglycidyl naphthalene, 1,6-diglycidyl naphthalene, 1,7-diglycidyl naphthalene, 2,7-diglycidyl naphthalene, triglycidyl naphthalene, and 1,2,5,6-tetraglycidyl naphthalene.

Examples of the epoxy monomer having an adamantane backbone include 1,3-bis(4-glycidyloxyphenyl)adamantane, and 2,2-bis(4-glycidyloxyphenyl)adamantane.

Examples of the epoxy monomer having a fluorene backbone include 9,9-bis(4-glycidyloxyphenyl)fluorene, 9,9-bis(4-glycidyloxy-3-methylphenyl)fluorene, 9,9-bis(4-glycidyloxy-3-chlorophenyl)fluorene, 9,9-bis(4-glycidyloxy-3-bromophenyl)fluorene, 9,9-bis(4-glycidyloxy-3-fluorophenyl)fluorene, 9,9-bis(4-glycidyloxy-3-methoxyphenyl)fluorene, 9,9-bis(4-glycidyloxy-3,5-dimethylphenyl)fluorene, 9,9-bis(4-glycidyloxy-3,5-dichlorophenyl)fluorene, and 9,9-bis(4-glycidyloxy-3,5-dibromophenyl)fluorene.

Examples of the epoxy monomer having a biphenyl backbone include 4,4'-diglycidylbiphenyl, and 4,4'-diglycidyl-3,3',5,5'-tetramethylbiphenyl.

Examples of the epoxy monomer having a bi(glycidyloxyphenyl)methane backbone include 1,1'-bi(2,7-glycidyloxynephthyl)methane, 1,8'-bi(2,7-glycidyloxynephthyl)methane, 1,1'-bi(3,7-glycidyloxynephthyl)methane, 1,8'-bi(3,7-glycidyloxynephthyl)methane, 1,1'-bi(3,5-glycidyloxynephthyl)methane, 1,8'-bi(3,5-glycidyloxynephthyl)methane, 1,2'-bi(2,7-glycidyloxynephthyl)methane, 1,2'-bi(3,7-glycidyloxynephthyl)methane, and 1,2'-bi(3,5-glycidyloxynephthyl)methane.

Examples of the epoxy monomer having a xanthene backbone include 1,3,4,5,6,8-hexamethyl-2,7-bis-oxylanylmethoxy-9-phenyl-9H-xanthene.

Concrete examples of (A1b) heat-curable compound include 4,4'-bis[(3-ethyl-3-oxetanyl)methoxymethyl]biphenyl, 1,4-benzene dicarboxylic acid bis[(3-ethyl-3-oxetanyl)methyl]ester, 1,4-bis[(3-ethyl-3-oxetanyl)methoxymethyl]benzene, and oxetane modified phenol novolak. Only one kind of (A1b) heat-curable compound may be used, and two or more kinds thereof may be used in combination.

From the viewpoint of further improving the heat resistance of the cured product, it is preferred that (A1) heat-curable compound contains a heat-curable compound having two or more cyclic ether groups.

From the viewpoint of further improving the heat resistance of the cured product, in 100 wt % of (A1) heat-curable compound, the content of the heat-curable compound having two or more cyclic ether groups is preferably 70 wt % or more, preferably 80 wt % or more, and preferably 100 wt % or less. In 100 wt % of (A1) heat-curable compound, the content of the heat-curable compound having two or more cyclic ether groups may be 10 wt % or more and 100 wt % or less. The whole of (A1) heat-curable compound may be a heat-curable compound having two or more cyclic ether groups.

(A1) Heat-curable compound has a molecular weight of less than 10000. The molecular weight of (A1) heat-curable compound is preferably 200 or more, and preferably 1200 or less, more preferably 600 or less, further preferably 550 or less. When the molecular weight of (A1) heat-curable compound is equal to the aforementioned lower limit or more, the pressure-sensitive adhesion of the surface of the cured product decreases, and the handleability of the resin material further increases. When the molecular weight of (A1) heat-curable compound is equal to the aforementioned upper limit or less, the adhesion of the cured product further increases. In addition, the cured product is hard and is difficult to become fragile, and the adhesion of the cured product further increases.

In the present specification, the molecular weight in (A1) heat-curable compound means a molecular weight that can be calculated from a structural formula of (A1) heat-curable compound when (A1) heat-curable compound is not a polymer, and when the structural formula is identifiable, and means a weight average molecular weight when (A1) heat-curable compound is a polymer. The weight average molecular weight is a weight average molecular weight in terms of polystyrene, measured by gel permeation chromatography (GPC). In gel permeation chromatography (GPC) measurement, it is preferred to use tetrahydrofuran as an eluate.

In 100 vol % of the resin material, the content of (A1) heat-curable compound is preferably 10 vol % or more, more preferably 20 vol % or more, and preferably 90 vol % or less, more preferably 80 vol % or less. When the content of (A1) heat-curable compound is equal to the aforementioned lower limit or more, the adhesion and heat resistance of the cured product further increase. When the content of (A1) heat-curable compound is equal to the aforementioned upper limit or less, the coating performance of the resin material further increases.

(A2) Heat-Curable Compound Having a Molecular Weight of 10000 or More:

(A2) Heat-curable compound is a heat-curable compound having a molecular weight of 10000 or more. Since (A2) heat-curable compound has a molecular weight of 10000 or more, (A2) heat-curable compound is generally a polymer, and the molecular weight generally means a weight average molecular weight.

From the viewpoint of increasing the heat resistance and moisture resistance of the cured product more effectively, it is preferred that (A2) heat-curable compound has an aromatic backbone. When (A2) heat-curable compound is a polymer, and (A2) heat-curable compound has an aromatic backbone, (A2) heat-curable compound may have the aromatic backbone in any part of the entire polymer, and may have the aromatic backbone in a main chain backbone, or in a side chain. From the viewpoint of further increasing the heat resistance of the cured product and further increasing the moisture resistance of the cured product, it is preferred that (A2) heat-curable compound has the aromatic backbone in a main chain backbone. Only one kind of (A2) heat-curable compound may be used, and two or more kinds thereof may be used in combination.

Examples of the aromatic backbone include, but are not particularly limited to, a naphthalene backbone, a fluorene backbone, a biphenyl backbone, an anthracene backbone, a pyrene backbone, a xanthene backbone, an adamantane backbone, and a bisphenol A backbone. From the viewpoint of increasing the cooling-heating cycle resistance and the heat resistance of the cured product more effectively, it is preferred that the aromatic backbone is a biphenyl backbone or a fluorene backbone.

Examples of (A2) heat-curable compound include, but are not particularly limited to, a styrene resin, a phenoxy resin, an oxetane resin, an epoxy resin, an episulfide resin, a (meth)acryl resin, a phenol resin, an amino resin, an unsaturated polyester resin, a polyurethane resin, a silicone resin and a polyimide resin.

From the viewpoint of controlling the oxidation degradation of the cured product, further increasing the cooling-heating cycle resistance and the heat resistance of the cured product, and further lowering the water absorption of the cured product, (A2) heat-curable compound is preferably a styrene resin, a phenoxy resin or an epoxy resin, more preferably a phenoxy resin or an epoxy resin, further preferably a phenoxy resin. In particular, by using a phenoxy resin or an epoxy resin, the heat resistance of the cured product further increases. Also, by using a phenoxy resin, the modulus of elasticity of the cured product is further lowered, and the cooling-heating cycle resistance of the cured product further increases.

(A2) Heat-Curable Compound May not have a Cyclic Ether Group Such as an Epoxy Group.

Concrete examples of the styrene resin that can be used include a homopolymer of a styrene monomer, and a copolymer of a styrene monomer and an acryl monomer. A styrene polymer having a structure of styrene-glycidyl methacrylate is preferred.

Examples of the styrene monomer include styrene, o-methylstyrene, m-methylstyrene, p-methylstyrene, p-methoxystyrene, p-phenylstyrene, p-chlorostyrene, p-ethylstyrene, p-n-butylstyrene, p-tert-butylstyrene, p-n-hexylstyrene, p-n-octylstyrene, p-n-nonylstyrene, p-n-decylstyrene, p-n-dodecylstyrene, 2,4-dimethylstyrene and 3,4-dichlorostyrene.

Concrete examples of the phenoxy resin include a resin obtained by reaction between epihalohydrin and a dihydric phenol compound, and a resin obtained by reaction between a bivalent epoxy compound and a dihydric phenol compound.

It is preferred that the phenoxy resin has a bisphenol A type backbone, a bisphenol F type backbone, a bisphenol A/F mixed type backbone, a naphthalene backbone, a fluorene backbone, a biphenyl backbone, an anthracene backbone, a pyrene backbone, a xanthene backbone, an adamantane backbone or a dicyclopentadiene backbone. The phenoxy resin more preferably has a bisphenol A type backbone, a bisphenol F type backbone, a bisphenol A/F mixed type backbone, a naphthalene backbone, a fluorene backbone or a biphenyl backbone, further preferably has at least one backbone of a fluorene backbone and a biphenyl backbone. By using a phenoxy resin having such a preferred backbone, the heat resistance of the cured product further increases.

The epoxy resin is an epoxy resin other than the phenoxy resin. Examples of the epoxy resin include an epoxy resin containing a styrene backbone, a bisphenol A type epoxy resin, a bisphenol F type epoxy resin, a bisphenol S type epoxy resin, a phenol novolak type epoxy resin, a bisphenol type epoxy resin, a naphthalene type epoxy resin, a fluorene type epoxy resin, a phenol aralkyl type epoxy resin, a naphthoaralkyl type epoxy resin, a dicyclopentadiene type epoxy resin, an anthracene type epoxy resin, an epoxy resin having an adamantane backbone, an epoxy resin having a tricyclodecane backbone, and an epoxy resin having a triazine nucleus in the backbone.

(A2) Heat-curable compound has a molecular weight of 10000 or more. The molecular weight of (A2) heat-curable compound is preferably 30000 or more, more preferably 40000 or more, and preferably 1000000 or less, more preferably 250000 or less. When the molecular weight of (A2) heat-curable compound is equal to the aforementioned lower limit or more, the cured product is difficult to thermally degrade. When the molecular weight of (A2) heat-curable compound is equal to the aforementioned upper limit or less, compatibility between (A2) heat-curable compound and other component increases. As a result, the heat resistance of the cured product further increases.

In 100 vol % of the resin material, the content of (A2) heat-curable compound is preferably 20 vol % or more, more preferably 30 vol % or more, and preferably 60 vol % or less, more preferably 50 vol % or less. When the content of (A2) heat-curable compound is equal to the aforementioned lower limit or more, the handleability of the resin material is further improved. When the content of (A2) heat-curable compound is equal to the aforementioned upper limit or less, the coating performance of the resin material further increases.

(Heat-Curable Component: Heat Curing Agent)

The heat curing agent is not particularly limited. As the heat curing agent, a heat curing agent capable of curing the heat-curable compound can be appropriately used. In the present specification, the heat curing agent includes a curing catalyst. Only one kind of the heat curing agent may be used and two or more kinds thereof may be used in combination.

From the viewpoint of increasing the heat resistance of the cured product more effectively, it is preferred that the heat curing agent has an aromatic backbone or an alicyclic backbone. The heat curing agent preferably includes an amine curing agent (amine compound), an imidazole curing agent, a phenol curing agent (phenol compound) or an acid anhydride curing agent (acid anhydride), more preferably includes an amine curing agent. It is preferred that the acid anhydride curing agent includes an acid anhydride having an aromatic backbone, a hydrate of the acid anhydride or a modified product of the acid anhydride, or includes an acid anhydride having an alicyclic backbone, a hydrate of the acid anhydride or a modified product of the acid anhydride.

Examples of the amine curing agent include dicyandiamide, an imidazole compound, diaminodiphenyl methane and diaminodiphenyl sulfone. From the viewpoint of increasing the adhesion of the cured product more effectively, it is more preferred that the amine curing agent is dicyandiamide or an imidazole compound. From the viewpoint of increasing the storage stability of the resin material more effectively, the heat curing agent preferably includes a curing agent having a melting point of 180° C. or more, more preferably includes an amine curing agent having a melting point of 180° C. or more.

Examples of the imidazole curing agent include 2-undecyl imidazole, 2-heptadecylimidazole, 2-methylimidazole, 2-ethyl-4-methylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1°]-ethyl-s-triazine, 2,4-diamino-6-[2'-methylimidazolyl-(1')]-ethyl-s-triazine isocyanuric acid adduct, 2-phenylimidazole isocyanuric acid adduct, 2-methylimidazole isocyanuric acid adduct, 2-phenyl-4,5-dihydroxymethylimidazole and 2-phenyl -4-methyl-5-dihydroxymethylimidazole.

Examples of the phenol curing agent include phenol novolak, o-cresol novolak, p-cresol novolak, t-butylphenol novolak, dicyclopentadiene cresol, poly(p-vinylphenol), bisphenol A type novolak, xylylene-modified novolak, decalin-modified novolak, poly(di-o-hydroxyphenyl)methane, poly(di-m-hydroxyphenyl)methane, and poly(di-p-hydroxyphenyl)methane. From the viewpoint of increasing the flexibility and the flame retardancy of the cured product more effectively, it is preferred that the phenol curing agent is a phenol resin having a melamine backbone, a phenol resin having a triazine backbone, or a phenol resin having an allyl group.

Examples of the commercially available phenol curing agent include MEH-8005, MEH-8010 and MEH-8015 (all of these are available from MEIWA PLASTIC INDUSTRIES, LTD.), YLH903 (available from Mitsubishi Chemical Corporation), LA-7052, LA-7054, LA-7751, LA-1356 and LA-3018-50P (all of these are available from DIC CORPORATION), and PS6313 and PS6492 (all of these are available from Gun Ei Chemical Industry Co., Ltd.).

Examples of the acid anhydride having an aromatic backbone, hydrates of the acid anhydride or modified products of the acid anhydride include styrene/maleic anhydride copolymer, benzophenone tetracarboxylic anhydride, pyromellitic anhydride, trimellitic anhydride, 4,4'-oxydiphthalic anhydride, phenylethynylphthalic anhydride, glycerol bis(anhydrotrimellitate) monoacetate, ethyleneglycol bis (anhydrotrimellitate), methyltetrahydrophthalic anhydride, methylhexahydrophthalic anhydride, and trialkyltetrahydrophthalic anhydride.

Examples of commercially available products of the acid anhydride having an aromatic backbone, hydrates of the acid anhydride or modified products of the acid anhydride include SMA resin EF30, SMA resin EF40, SMA resin EF60 and SMA resin EF80 (all of these are available from Sartomer Japan), ODPA-M and PEPA (both of these are available from Manac Incorporated), RIKACID MTA-10, RIKACID MTA-15, RIKACID TMTA, RIKACID TMEG-100, RIKACID TMEG-200, RIKACID TMEG-300, RIKACID TMEG-500, RIKACID TMEG-S, RIKACID TH, RIKACID HT-1A, RIKACID HH, RIKACID MH-700, RIKACID MT-500, RIKACID DSDA and RIKACID TDA-100 (all of these are available from New Japan Chemical Co., Ltd.), and EPICLON B4400, EPICLON B650, and EPICLON B570 (all of these are available from DIC CORPORATION).

It is preferred that the acid anhydride having an alicyclic backbone, a hydrate of the acid anhydride or a modified product of the acid anhydride is an acid anhydride having a polyalicyclic backbone, a hydrate of the acid anhydride or a modified product of the acid anhydride, or an acid anhydride having an alicyclic backbone obtained by an addition reaction between a terpene compound and maleic anhydride, a hydrate of the acid anhydride or a modified product of the acid anhydride. By using such a curing agent, flexibility of the cured product and the moisture resistance and the adhesion of the cured product further increase.

Examples of the acid anhydride having an alicyclic backbone, hydrates of the acid anhydride or modified products of the acid anhydride include also methylnadic anhydride, an acid anhydride having a dicyclopentadiene backbone, or a modified product of the acid anhydride.

Examples of commercially available products of the acid anhydride having an alicyclic backbone, hydrates of the acid anhydride or modified products of the acid anhydride include RIKACID HNA and RIKACID HNA-100 (all of these are available from New Japan Chemical Co., Ltd.), and EPICURE YH306, EPICURE YH307, EPICURE YH308H and EPICURE YH309 (all of these are available from Mitsubishi Chemical Corporation).

It is also preferred that the heat curing agent is methylnadic anhydride or trialkyltetrahydro phthalic anhydride. By using methylnadic anhydride or trialkyltetrahydro phthalic anhydride, the water resistance of the cured product increases.

In 100 vol % of the resin material, the content of the heat curing agent is preferably 0.1 vol % or more, more preferably 1 vol % or more, and preferably 40 vol % or less, more preferably 25 vol % or less. When the content of the heat curing agent is equal to the aforementioned lower limit or more, it becomes still easier to cure the heat-curable compound sufficiently. When the content of the heat curing agent is equal to the aforementioned upper limit or less, an excessive heat curing agent that is not involved in curing becomes difficult to arise. Therefore, the heat resistance and the adhesion of the cured product further increase.

(Photo-Curable Component: Photo-Curable Compound)

The photo-curable compound is not particularly limited as long as it has photo-curability. Only one kind of the photo-curable compound may be used, and two or more kinds thereof may be used in combination.

It is preferred that the photo-curable compound has two or more ethylenic unsaturated bonds.

Examples of the group containing an ethylenic unsaturated bond include a vinyl group, an allyl group, and a (meth)acryloyl group. From the viewpoint of making the reaction proceed effectively, and further suppressing foaming, peeling and decoloring of the cured product, a (meth) acryloyl group is preferred. It is preferred that the photo-curable compound has a (meth)acryloyl group.

From the viewpoint of increasing the adhesion of the cured product more effectively, it is preferred that the photo-curable compound contains epoxy (meth)acrylate. From the viewpoint of increasing the heat resistance of the cured product more effectively, it is preferred that the epoxy (meth)acrylate includes bifunctional epoxy (meth) acrylate, and tri- or more functional epoxy (meth)acrylate. It is preferred that the bifunctional epoxy (meth)acrylate has two (meth)acryloyl groups. It is preferred that the tri- or more functional epoxy (meth)acrylate has three or more (meth) acryloyl groups.

Epoxy (meth)acrylate is obtained by reaction between (meth)acrylic acid and an epoxy compound. Epoxy (meth) acrylate can be obtained by converting an epoxy group into a (meth)acryloyl group. Since the photo-curable compound is cured by irradiation with light, it is preferred that epoxy (meth)acrylate does not have an epoxy group.

Examples of the epoxy (meth)acrylate include bisphenol type epoxy (meth)acrylate (e.g., bisphenol A type epoxy (meth)acrylate, bisphenol F type epoxy (meth)acrylate, bisphenol S type epoxy (meth)acrylate), cresol novolak type epoxy (meth)acrylate, amine-modified bisphenol type epoxy (meth)acrylate, caprolactone-modified bisphenol type epoxy (meth) acrylate, carboxylic anhydride-modified epoxy (meth)acrylate, and phenol novolak type epoxy (meth) acrylate.

In 100 vol % of the resin material, the content of the photo-curable compound is preferably 5 vol % or more, more preferably 10 vol % or more, and preferably 40 vol % or less, more preferably 30 vol % or less. When the content of the photo-curable compound is in the range from the aforementioned lower limit to the aforementioned upper limit, the adhesion of the cured product further increases.

(Photo-Curable Component: Photopolymerization Initiator)

The photopolymerization initiator is not particularly limited. As the photopolymerization initiator, a photopolymerization initiator capable of curing the photo-curable compound by irradiation with light can be appropriately used. Only one kind of the photopolymerization initiator may be used, and two or more kinds thereof may be used in combination.

Examples of the photopolymerization initiator include acylphosphine oxide, halomethylated triazine, halomethylated oxadiazole, imidazole, benzoine, benzoine alkylether, anthraquinone, benzanthrone, benzophenone, acetophenone, thioxanthone, benzoic ester, acridine, phenazine, titanocene, α-aminoalkylphenone, oxime, and derivatives thereof.

Examples of the benzophenone photopolymerization initiator include methyl o-benzoyl benzoate and Michler's ketone. Examples of commercially available products of the benzophenone photopolymerization initiator include EAB (available from Hodogaya Chemical Co., Ltd.).

Examples of commercially available products of the acetophenone photopolymerization initiator include DAROCUR 1173, DAROCUR 2959, IRGACURE 184, IRGACURE 907, and IRGACURE 369 (all of these are available from BASF).

Examples of commercially available products of the benzoine photopolymerization initiator include IRGACURE 651 (available from BASF).

Examples of commercially available products of the acylphosphine oxide photopolymerization initiator include Lucirin TPO, and IRGACURE 819 (all of these are available from BASF).

Examples of commercially available products of the thioxanthone photopolymerization initiator include isopropylthioxanthone, and diethylthioxanthone.

Examples of commercially available products of the oxime photopolymerization initiator include IRGACURE OXE-01, and IRGACURE OXE-02 (all of these are available from BASF).

The content of the photopolymerization initiator relative to 100 parts by weight of the photo-curable compound is preferably 1 part by weight or more, more preferably 3 parts by weight or more, and preferably 20 parts by weight or less, more preferably 15 parts by weight or less. When the content of the photopolymerization initiator is in the range from the aforementioned lower limit to the aforementioned upper limit, the photo-curable compound can be photo-cured satisfactorily.

(Insulating Filler)

The resin material according to the present invention may contain an insulating filler. The insulating filler is neither the first boron nitride aggregate particles nor the second boron nitride aggregate particles. The insulating filler has insulating properties. The insulating filler may be an organic filler, or an inorganic filler. Only one kind of the insulating filler may be used, and two or more kinds thereof may be used in combination.

From the viewpoint of improving the thermal conductivity more effectively, it is preferred that the insulating filler is an inorganic filler. From the viewpoint of improving the thermal conductivity more effectively, it is preferred that the insulating filler has a coefficient of thermal conductivity of 10 W/m·K or more.

From the viewpoint of improving the thermal conductivity of the cured product more effectively, the coefficient of thermal conductivity of the insulating filler is preferably 10 W/m·K or more, more preferably 20 W/m·K or more. The upper limit of the coefficient of thermal conductivity of the insulating filler is not particularly limited. Inorganic fillers having a coefficient of thermal conductivity of about 300 W/m·K are widely known, and inorganic fillers having a coefficient of thermal conductivity of about 200 W/m·K are easily available.

The material of the insulating filler is not particularly limited. Examples of the material of the insulating filler include nitrogen compounds (boron nitride, aluminum nitride, silicon nitride, carbon nitride, and titanium nitride), carbon compounds (silicon carbide, fluorocarbon, boron carbide, titanium carbide, tungsten carbide, and diamond), and metal oxides (silica, alumina, zinc oxide, magnesium oxide, and beryllium oxide). The material of the insulating filler is preferably the aforementioned nitrogen compounds, the aforementioned carbon compounds, or the aforementioned metal oxides, more preferably alumina, boron nitride, aluminum nitride, silicon nitride, silicon carbide, zinc oxide or magnesium oxide. By using such a preferred insulating filler, the thermal conductivity of the cured product is further improved.

It is preferred that the insulating filler is spherical particles, or unaggregated particles and aggregate particles having an aspect ratio of more than 2. By using such an insulating filler, the thermal conductivity of the cured product is further improved. The spherical particles have an aspect ratio of 2 or less.

The material of the insulating filler has a new Mohs hardness of preferably 12 or less, more preferably 9 or less. When the new Mohs hardness of the material of the insulating filler is 9 or less, the workability of the cured product further increases.

From the viewpoint of increasing the workability of the cured product more effectively, it is preferred that the material of the insulating filler is boron nitride, synthetic magnesite, crystalline silica, zinc oxide or magnesium oxide. The material of the inorganic filler has a new Mohs hardness of 9 or less.

From the viewpoint of improving the thermal conductivity more effectively, the insulating filler has a particle diameter of preferably 0.1 μm or more and preferably 20 μm or less. When the particle diameter is equal to the aforementioned lower limit or more, it is possible to easily pack the insulating filler with a high density. When the particle diameter is equal to the aforementioned upper limit or less, the thermal conductivity of the cured product is further improved.

The particle diameter means a mean particle size determined from the particle size distribution determination result on volume average measured by a laser diffraction type particle size distribution measuring device. The particle diameter of the insulating filler is preferably calculated by sampling 3 g of the insulating filler, and averaging the particle diameters of the insulating filler contained therein. Regarding the method for calculating a mean particle diameter of the insulating filler, it is preferred to adopt a particle diameter of the insulating filler at a cumulative volume of 50% (d50) as a mean particle diameter.

From the viewpoint of improving the thermal conductivity more effectively, in 100 vol % of the resin material, the content of the insulating filler is preferably 1 vol % or more, more preferably 3 vol % or more, and preferably 20 vol % or less, more preferably 10 vol % or less.

(Other Components)

The resin material may further contain other components that are generally used in a resin material, a resin sheet and a curable sheet, such as a dispersing agent, a chelating agent, an antioxidant and so on in addition to the components as described above.

(Other Details of Resin Material and Cured Product)

The resin material may be a paste or a curable paste. The resin material may be a resin sheet or a curable sheet. When the resin material contains a curable component, it is possible to obtain a cured product by curing the resin material. The cured product is a cured product of the resin material, and is formed of the resin material.

From the viewpoint of improving the insulating properties and the thermal conductivity more effectively, the resin material may be prepared by laminating two or more layers of resin sheets. In the two or more layers of resin sheets, one or more layers may be resin sheets according to the present invention, and all layers may be resin sheets according to the present invention.

(Laminate)

A laminate according to the present invention includes a thermal conductor, an insulating layer, and a conductive layer. The insulating layer is laminated on one face of the thermal conductor. The conductive layer is laminated on the face opposite to the thermal conductor of the insulating layer. On the other face of the thermal conductor, the insulating layer may be laminated. In the laminate according to the present invention, the material of the insulating layer is the aforementioned resin material.

Thermal Conductor:

The thermal conductor has a coefficient of thermal conductivity of preferably 10 W/m·K or more. As the thermal conductor, an appropriate thermal conductor can be used. It is preferred to use a metal material for the thermal conductor. Examples of the metal material include a metal foil, and a metal plate. The thermal conductor is preferably the metal foil or the metal plate, more preferably the metal plate.

Examples of the material of the metal material include aluminum, copper, gold, silver and graphite sheets. From the viewpoint of improving the thermal conductivity more effectively, the material of the metal material is preferably aluminum, copper, or gold, more preferably aluminum or copper.

Conductive Layer:

The metal for forming the conductive layer is not particularly limited. Examples of the metal include gold, silver, palladium, copper, platinum, zinc, iron, tin, lead, aluminum, cobalt, indium, nickel, chromium, titanium, antimony, bismuth, thallium, germanium, cadmium, silicon, tungsten, molybdenum, and alloys thereof. Examples of the metal include indium tin-doped oxide (ITO) and solder. From the viewpoint of improving the thermal conductivity more effectively, aluminum, copper or gold, is preferred, and aluminum or copper is more preferred.

The method for forming the conductive layer is not particularly limited. Examples of the method for forming the conductive layer include an electroless plating method, an electroplating method, and a method of bonding the insulating layer and the metal foil by thermocompression. The method of bonding the insulating layer and the metal foil by thermocompression is preferred because the conductive layer can be formed easily.

Figure 1:
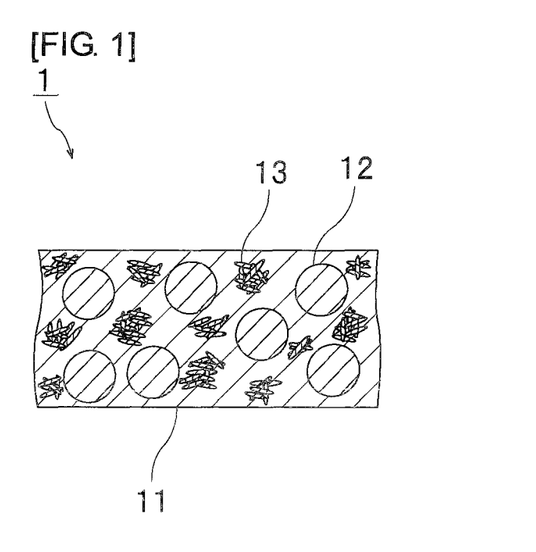
FIG. 1 is a sectional view schematically showing a resin sheet according to one embodiment of the present invention.

FIG. 1 is a sectional view schematically showing a resin sheet according to one embodiment of the present invention. In FIG. 1, the size and the thickness are different from the actual size and thickness for convenience of drawing.

A resin sheet 1 (resin material) shown in FIG. 1 includes a binder resin 11, first boron nitride aggregate particles 12, and second boron nitride aggregate particles 13. It is preferred that the first boron nitride aggregate particles 12 and the second boron nitride aggregate particles 13 are the first boron nitride aggregate particles and the second boron nitride aggregate particles as described above. The K value (compression modulus of elasticity) of the first boron nitride aggregate particles 12 and the K value (compression modulus of elasticity) of the second boron nitride aggregate particles 13 are different from each other.

In the resin sheet 1 according to the present embodiment, the binder resin 11 contains a curable component. The binder resin 11 may contain a heat-curable component including a heat-curable compound and a heat curing agent, or contain a photo-curable component including a photo-curable compound and a photopolymerization initiator. It is preferred that the binder resin is not completely cured. The binder resin may be B-staged by heating or the like. The binder resin may be a B-staged B-staged product.

In the resin sheet, voids can be present inside the sheet. In the resin sheet, voids can be present between the first boron nitride aggregate particles and the second boron nitride aggregate particles.

Figure 2:
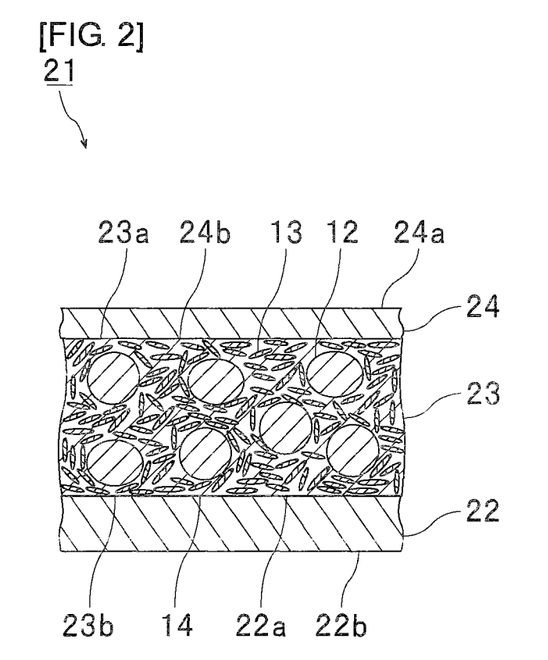
FIG. 2 is a sectional view schematically showing a laminate obtained by using a resin material according to one embodiment of the present invention.

FIG. 2 is a sectional view schematically showing a laminate obtained by using a resin material according to one embodiment of the present invention. In FIG. 2, the size and the thickness are different from the actual size and thickness for convenience of drawing.

A laminate 21 shown in FIG. 2 includes a thermal conductor 22, an insulating layer 23, and a conductive layer 24. The thermal conductor 22, the insulating layer 23, and the conductive layer 24 are the thermal conductor, the insulating layer, and the conductive layer as described above. In FIG. 2, the resin sheet 1 shown in FIG. 1 is used as the insulating layer 23.

The thermal conductor 22 has one face 22a (first face) and the other face 22b (second face). The insulating layer 23 has one face 23a (first face) and the other face 23b (second face). The conductive layer 24 has one face 24a (first face) and the other face 24b (second face).

On the side of the one face 23a (first face) of the insulating layer 23, the conductive layer 24 is laminated. On the side of the other face 23b (second face) of the insulating layer 23, the thermal conductor 22 is laminated. On the side of the other face 24b (second face) of the conductive layer 24, the insulating layer 23 is laminated. On the side of the one face 22a (first face) of the thermal conductor 22, the insulating layer 23 is laminated.

Between the thermal conductor 22 and the conductive layer 24, the insulating layer 23 is disposed.

The method for producing the laminate is not particularly limited. As the method for producing the laminate, a method of laminating the thermal conductor, the insulating layer, and the conductive layer, and subjecting these to thermocompression bonding by vacuum pressing or the like can be recited.

In the laminate 21 according to the present embodiment, the insulating layer 23 includes a cured product part 14, the first boron nitride aggregate particles 12, and the second boron nitride aggregate particles 13. The insulating layer 23 is formed of the resin sheet 1 shown in FIG. 1. It is preferred that the insulating layer is formed by subjecting the resin sheet to thermocompression bonding by vacuum pressing or the like.

In the laminate 21 according to the present embodiment, it is preferred that the first boron nitride aggregate particles 12 do not deform or collapse by a compressive force of pressing or the like, and it is preferred that they keep the shapes. It is preferred that the first boron nitride aggregate particles 12 exist in the form of aggregate particles (secondary particles) in the cured product.

In the laminate 21 according to the present embodiment, the second boron nitride aggregate particles 13 may deform or collapse by a compressive force of pressing or the like. The second boron nitride aggregate particles may be deformed aggregate particles (secondary particles), or primary particles as a result of collapse of the aggregate particles (secondary particles). The second boron nitride aggregate particles 13 may exist in the form of deformed aggregate particles (secondary particles) in the cured product, or in the form of primary particles as a result of collapse of the aggregate particles (secondary particles).

In the cured product part 14, the second boron nitride aggregate particles 13 deform or collapse around the first boron nitride aggregate particles 12. The deformed or collapsed second boron nitride aggregate particles 13 exist between the first boron nitride aggregate particles 12. The deformed or collapsed second boron nitride aggregate particles 13 are capable of filling voids existing between the first boron nitride aggregate particles 12, so that the insulating properties can be effectively improved. In the laminate 21, voids between the first boron nitride aggregate particles 12 can be filled with the second boron nitride aggregate particles 13 without any clearance, so that it is possible to effectively control the variation in dielectric breakdown strength.

In the cured product part 14, the moderately deformed or collapsed second boron nitride aggregate particles 13 are densely located around the first boron nitride aggregate particles 12. By the densely located second boron nitride aggregate particles 13, the compressive force is applied to the first boron nitride aggregate particles 12 not only in the thickness (pressing) direction but also in the planar direction, so that the (spherical) shape of the aggregate particles can be kept, and the thermal conductivity can be improved effectively.

In the present embodiment, the cured product part 14 is a cured part derived from the binder resin 11. The cured product part 14 is obtained by curing the binder resin 11. The cured product part 14 may be a cured part derived from a heat-curable component including a heat-curable compound and a heat curing agent, or a cured part derived from a photo-curable component including a photo-curable compound and a photopolymerization initiator. The cured product part 11 is obtained by curing a heat-curable component or a photo-curable component.

The resin material and the cured product can be used in various applications in which high thermal conductivity, high mechanical strength and so on are required. The laminate is used, for example, in an electronic device, while the laminate is disposed between a heat generating part and a heat dissipating part. For example, the laminate is used as a radiator installed between a CPU and a fin, or as a radiator of a power card utilized in an inverter or the like of an electric car. Also, by forming a circuit for the conductive layer of the laminate by a technique such as etching, it is possible to use the laminate as an insulating circuit board.

Hereinafter, the present invention is illustrated by giving concrete examples and comparative examples of the present invention. The present invention is not limited to the following examples.

Heat-Curable Compound:
(1) "EPIKOTE 828US" available from Mitsubishi Chemical Corporation, epoxy compound
(2) "DL-92" available from MEIWA PLASTIC INDUSTRIES, LTD., phenol novolak compound Heat Curing Agent:
(1) "Dicyandiamide" available from TOKYO CHEMICAL INDUSTRY CO., LTD.
(2) "2MZA-PW" available from SHIKOKU CHEMICALS CORPORATION, isocyanuric-modified solid dispersed imidazole First Boron Nitride Aggregate Particles (Including Alternatives Thereof):
(1) "PTX60S" available from MOMENTIVE
(2) "PT350" available from MOMENTIVE
(3) "AC6091" available from MOMENTIVE
(4) "UHP-G1F" available from SHOWA DENKO K.K.

Second Boron Nitride Aggregate Particles (Including Alternatives Thereof):
(1) Boron nitride aggregate particles 1
(2) Boron nitride aggregate particles 2
(3) Boron nitride aggregate particles 3
(4) Boron nitride aggregate particles 4
(5) "AC6091" available from MOMENTIVE Method for Preparing "Boron Nitride Aggregate Particles 1":

Particles were prepared by aggregating primary particles of boron nitride having a mean major axis of 7.2 μm, and an aspect ratio of 5.3 so that a porosity was 44%, and a mean particle diameter was 40 μm by a spray drying method. A porosity was measured by a mercury porosimeter, and a porosity when only a void of 5 μm or less was regarded as an intraparticle void was calculated.

Porosity was determined in the following manner.

Method for Determining Porosity:

An integrated immersion amount of mercury with respect to the pressure applied by the mercury porosimetry was measured by using a mercury porosimeter "PoreMaster 60" available from Quantachrome Instruments. For weighed 0.2 to 0.3 g of boron nitride aggregate particles, measurement was conducted in a low pressure mode and in a high pressure mode. From the obtained data, a distribution curve showing the pore volume per unit section of the pore diameter was obtained. On the basis of the distribution curve, a value (V) obtained by subtracting voids between particles from all voids was calculated. From a distribution curve, voids with a pore diameter of 5 μm or more were regarded as voids between particles. Using the density ($\rho$=2.34) of boron nitride particles which are primary particles, porosity ($\varepsilon$) can be expressed by the following formula.

$$\varepsilon = V/(V+(1/\rho)) \times 100$$

The obtained value of V was substituted into the above formula to calculate porosity.

Method for Preparing "Boron Nitride Aggregate Particles 2":

Particles were prepared by aggregating primary particles of boron nitride having a mean major axis of 6.8 μm, and an aspect ratio of 6.0 so that a porosity was 42%, and a mean particle diameter was 45 μm by a spray drying method.

Method for Preparing "Boron Nitride Aggregate Particles 3":

Particles were prepared by aggregating primary particles of boron nitride having a mean major axis of 6.3 μm, and an aspect ratio of 14 so that a porosity was 70%, and a mean particle diameter was 25 μm by a spray drying method.

Method for Preparing "Boron Nitride Aggregate Particles 4":

Particles were prepared by aggregating primary particles of boron nitride having a mean major axis of 9 μm, and an aspect ratio of 5.5 so that a porosity was 45%, and a mean particle diameter was 55 μm by a spray drying method.

(10% K value, 20% K value, and 30% K value of each of first boron nitride aggregate particles and second boron nitride aggregate particles)

A 10% K value, 20% K value, and 30% K value of each of the first boron nitride aggregate particles and the second boron nitride aggregate particles were determined in the following manner.

Method for Determining a 10% K Value, 20% K Value, and 30% K Value of Each of the First Boron Nitride Aggregate Particles and the Second Boron Nitride Aggregate Particles:

A diamond prism was used as a compressing member. Using a micro compression tester, a smooth end face of the compressing member was caused to descend toward the boron nitride aggregate particles in the condition of a compressing speed of 0.67 mN/second to compress the boron nitride aggregate particles. The maximum test load was 120 mN for the first boron nitride aggregate particles, and 80 mN for the second boron nitride aggregate particles. A load value (N) and a compressive deformation amount (mm) at this time were measured. As a determination result, a relationship between the compressive load value and the compressive displacement was obtained. The boron nitride aggregate particles to be measured were observed under a microscope, and boron nitride aggregate particles having a particle diameter of the particle diameter±10% was selected and measured. From the obtained load value (N) and compressive deformation amount (mm), compression modulus of elasticity at compression of 10%, 20%, and 30% (10% K value, 20% K value, and 30% K value) was calculated according to the following formula while taking a particle diameter into account. Also, a compression modulus of elasticity at each compressibility (10% K value, 20% K value, and 30% K value) was calculated as a mean compression modulus of elasticity obtained by averaging results of 20 times of measurement. The compressibility was calculated by (compressibility=compressive displacement mean particle diameter×100).

10% K value, 20% K value, or 30% K value (N/mm$^2$)=3·10$^3$·F/(D$^2$·X$^{3/2}$)

F: Load value (N) when the first or second boron nitride aggregate particles compressively deform by 10%, 20%, or 30%

D: Diameter (mm) of the first or second boron nitride aggregate particles

X: Compressibility (%) of the first or second boron nitride aggregate particles

Compressibility of the first or second boron nitride aggregate particles X (%)=100·S/D S: Amount of compressive deformation (mm)

(Particle Diameter of First Boron Nitride Aggregate Particles and Second Boron Nitride Aggregate Particles)

A particle diameter of the first boron nitride aggregate particles and the second boron nitride aggregate particles was measured by using a "Laser diffraction type particle size distribution measuring device" available from HORIBA, Ltd. A particle diameter of the first boron nitride aggregate particles and the second boron nitride aggregate particles was calculated by sampling 3 g of each kind of the boron nitride aggregate particles, and averaging the particle diameters of the boron nitride aggregate particles contained therein. Regarding the method for calculating a mean particle diameter, a particle diameter of boron nitride aggregate particles at a cumulative volume of 50% (d50) was determined as a mean particle diameter in each of the first boron nitride aggregate particles and the second boron nitride aggregate particles.

(Mean Major Axis of Primary Particles Constituting First Boron Nitride Aggregate Particles and Second Boron Nitride Aggregate Particles (First Boron Nitride and Second Boron Nitride))

A mean major axis of primary particles constituting the first boron nitride aggregate particles and the second boron nitride aggregate particles (first boron nitride and second boron nitride) was calculated in the following manner.

Method for measuring a mean major axis of primary particles constituting the first boron nitride aggregate particles and the second boron nitride aggregate particles (first boron nitride and second boron nitride):

In an electron microscopic image of a cross section of a laminate prepared by mixing primary particles that constitute the first boron nitride aggregate particles and the second boron nitride aggregate particles (first boron nitride and second boron nitride) and a thermosetting resin or the like, randomly selected 50 primary particles constituting the boron nitride aggregate particles of each kind (each boron nitride) were measured for a major axis, and a mean value was calculated.

(Aspect ratio of primary particles constituting first boron nitride aggregate particles and second boron nitride aggregate particles (first boron nitride and second boron nitride))

An aspect ratio of primary particles constituting the first boron nitride aggregate particles and the second boron nitride aggregate particles (first boron nitride and second boron nitride) was calculated in the following manner.

Method for determining an aspect ratio of primary particles constituting the first boron nitride aggregate particles and the second boron nitride aggregate particles (first boron nitride and second boron nitride):

In the electron microscopic image of the cross section of the laminate prepared by mixing primary particles that constitute the first boron nitride aggregate particles and the second boron nitride aggregate particles (first boron nitride and second boron nitride) and a thermosetting resin or the like, randomly selected 50 primary particles constituting the boron nitride aggregate particles of each kind (each boron nitride) were measured for a major axis/minor axis, and a mean value was calculated.

Examples 1 to 11 and Comparative Examples 1 to 5

(1) Preparation of Resin Material

Ingredients shown in Tables 1, 2 below were mixed in a formulation shown in Tables 1, 2 below, and the mixture was stirred at 500 rpm for 25 minutes with a planetary stirrer to obtain a resin material.

(2) Preparation of Laminate

The obtained resin material was applied on a releasing PET sheet (thickness 50 μm) to have a thickness of 350 μm, and dried for 10 minutes in an oven at 90° C. to form a curable sheet (insulating layer) to obtain a laminate sheet. Then the releasing PET sheet was removed, and the curable sheet (insulating layer) was sandwiched on both faces by a copper foil and an aluminum plate, and they were subjected to a vacuum pressing in the conditions of a temperature of 200° C., and a pressure of 12 MPa to prepare a laminate.

(Evaluation)

(1) Coefficient of Thermal Conductivity

After cutting the obtained laminate into a 1 cm square, carbon black was sprayed on both faces to prepare a measurement sample. Using the obtained measurement sample, a coefficient of thermal conductivity was calculated according to the laser flash method. A coefficient of thermal conductivity in Tables 1, 2 is a relative value to a value of Comparative Example 1 as 1.00. For measurement of a coefficient of thermal conductivity, "LFA447" available from NETZSCH was used.

(2) Dielectric Breakdown Strength

By etching the copper foil in the obtained laminate, the copper foil was patterned into a circle of 2 cm in diameter, to obtain a test sample. An AC voltage was applied at 25° C. so that the voltage increased at a speed of 0.33 kV/second across the test sample with a dielectric strength tester ("MODEL7473" available from ETECH Electronics). The voltage at which a current of 10 mA flew in the test sample was determined as a dielectric breakdown voltage. The dielectric breakdown voltage was divided by the thickness of the test sample to calculate a dielectric breakdown strength. The dielectric breakdown strength was determined on the basis of the following criteria.

[Criteria for Dielectric Breakdown Strength]
  ○: 60 kV/mm or more
  Δ: 30 kV/mm or more and less than 60 kV/mm
  x: less than 30 kV/mm (3) Variation in Dielectric Breakdown Strength A total of 20 measurement samples were cut out from different positions of the obtained laminate, each piece having a size of 5 cm square. In the same manner as in the above (2), 20 test samples were prepared, and each test sample was calculated for dielectric breakdown strength. Variation in dielectric breakdown strength was determined on the basis of the following criteria.

[Criteria for Variation in Dielectric Breakdown Strength]
  ○: Difference between maximum value and minimum value of dielectric breakdown strength was less than 20 kV/mm
  Δ: Difference between maximum value and minimum value of dielectric breakdown strength was 20 kV/mm or more and less than 40 kV/mm
  x: Difference between maximum value and minimum value of dielectric breakdown strength was 40 kV/mm or more (4) Adhesion (Peeling Strength)

The obtained curable sheet (insulating layer 350 μm) was heated at 200° C. for 1 hour while it was pressed between an electrolytic copper foil (thickness 35 μm) and an aluminum plate (thickness 1 mm) at a pressure of 12 MPa to obtain a measurement sample. Thereafter, the measurement sample was cut out into a size of 5 cm×12 cm, and the copper foil was peeled off while the center part of 1 cm×12 cm on the short side was left. The peeling strength between the electrolytic copper foil and the insulating layer after curing in the center part of 1 cm was measured by a 90° peeling test. Adhesion (peeling strength) was determined on the basis of the following criteria.

[Criteria for Adhesion (Peeling Strength)]
  ○○: Peeling strength was 5 N/cm or more
  ○: Peeling strength was 4 N/cm or more and less than 5 N/cm
  Δ: Peeling strength was 2 N/cm or more and less than 4 N/cm
  x: Peeling strength was less than 2 N/cm The results are shown in Tables 1, 2 below.

TABLE 1

|  |  |  | Example 1 | Example 2 | Example 3 | Example 4 | Example 5 | Example 6 |
|---|---|---|---|---|---|---|---|---|
| Composition of resin material (wt %) | Heat-curable compound | EPIKOTE 828US DL-92 | 28.5 | 28.5 | 28.5 | 28.5 | 28.5 | 28.5 |
|  | Heat curing agent | Dicyandiamide | 1.0 | 1.0 | 1.0 | 1.0 | 1.0 | 1.0 |
|  |  | 2MZA-PW | 0.55 | 0.55 | 0.55 | 0.55 | 0.55 | 0.55 |
|  | Boron nitride aggregate particles (first kind) (first boron nitride aggregate particles or alternative thereof) | PTX60S | 35 |  |  |  |  |  |
|  |  | PT350 |  | 35 |  |  | 42 |  |
|  |  | AC6091 |  |  | 35 | 35 |  | 28 |
|  |  | UHP-G1F |  |  |  |  |  |  |
|  | Boron nitride aggregate particles (second kind) (second boron nitride aggregate particles or alternative thereof) | Boron nitride aggregate particles 1 | 35 | 35 | 35 |  |  | 42 |
|  |  | Boron nitride aggregate particles 2 |  |  |  | 35 | 28 |  |
|  |  | Boron nitride aggregate particles 3 |  |  |  |  |  |  |
|  |  | Boron nitride aggregate particles 4 |  |  |  |  |  |  |
|  |  | AC6091 |  |  |  |  |  |  |
| Total content of boron nitride aggregate particles (vol %) |  |  | 54 | 54 | 54 | 54 | 54 | 54 |
| Content of boron nitride aggregate particles (first kind) (vol %) |  |  | 27 | 27 | 32 | 27 | 32 | 22 |
| Content of boron nitride aggregate particles (second kind) (vol %) |  |  | 27 | 27 | 22 | 27 | 22 | 32 |
| K value (N/mm²) | Boron nitride aggregate particles (first kind) | 10% K value | 74 | 81 | 174 | 174 | 81 | 174 |
|  |  | 20% K value | 50 | 34 | 110 | 110 | 34 | 110 |
|  |  | 30% K value | 36 | 21 | 63 | 63 | 21 | 63 |
|  | Boron nitride aggregate particles (second kind) | 10% K value | 13 | 13 | 13 | 13 | 13 | 13 |
|  |  | 20% K value | 31 | 31 | 31 | 49 | 31 | 31 |
|  |  | 30% K value | 44 | 44 | 44 | 97 | 44 | 44 |
| Particle diameter (μm) | Boron nitride aggregate particles (first kind) |  | 60 | 120 | 100 | 100 | 120 | 100 |
|  | Boron nitride aggregate particles (second kind) |  | 40 | 40 | 40 | 45 | 45 | 40 |
| Mean major axis (μm) | Primary particles constituting boron nitride aggregate particles (first kind) |  | 7.3 | 7.9 | 17 | 17 | 7.9 | 17 |
|  | Primary particles constituting boron nitride aggregate particles (second kind) |  | 7.2 | 7.2 | 7.2 | 6.8 | 6.8 | 7.2 |
| Aspect ratio | Primary particles constituting boron nitride aggregate particles (first kind) |  | 13 | 12 | 6.3 | 6.3 | 12 | 6.3 |
|  | Primary particles constituting boron nitride aggregate particles (second kind) |  | 5.3 | 5.3 | 5.3 | 6.0 | 6.0 | 5.3 |
| Evaluation | (1) Coefficient of thermal conductivity |  | 1.52 | 1.43 | 1.40 | 1.38 | 1.41 | 1.42 |
|  | (2) Dielectric breakdown strength |  | ◯ | ◯ | ◯ | ◯ | ◯ | ◯ |
|  | (3) Variation in dielectric breakdown strength |  | ◯ | ◯ | ◯ | ◯ | ◯ | ◯ |
|  | (4) Adhesion (peeling strength) |  | ◯ | ◯◯ | ◯◯ | ◯◯ | ◯◯ | ◯◯ |

|  |  |  | Example 7 | Example 8 | Example 9 | Example 10 | Example 11 |
|---|---|---|---|---|---|---|---|
| Composition of resin material (wt %) | Heat-curable compound | EPIKOTE 828US DL-92 | 28.5 | 28.5 | 31.8 | 21.1 | 20.1 9.4 |
|  | Heat curing agent | Dicyandiamide | 1.0 | 1.0 | 1.1 | 0.7 |  |
|  |  | 2MZA-PW | 0.55 | 0.55 | 0.56 | 0.37 | 0.40 |
|  | Boron nitride aggregate particles (first kind) (first boron nitride aggregate particles or alternative thereof) | PTX60S |  | 35 |  |  | 35 |
|  |  | PT350 | 35 |  | 33.5 | 39 |  |
|  |  | AC6091 |  |  |  |  |  |
|  |  | UHP-G1F |  |  |  |  |  |
|  | Boron nitride aggregate particles (second kind) (second boron nitride aggregate particles or alternative thereof) | Boron nitride aggregate particles 1 |  |  | 33.5 | 39 | 35 |
|  |  | Boron nitride aggregate particles 2 |  |  |  |  |  |
|  |  | Boron nitride aggregate particles 3 | 35 |  |  |  |  |
|  |  | Boron nitride aggregate particles 4 |  | 35 |  |  |  |
|  |  | AC6091 |  |  |  |  |  |
| Total content of boron nitride aggregate particles (vol %) |  |  | 54 | 54 | 51 | 61 | 54 |
| Content of boron nitride aggregate particles (first kind) (vol %) |  |  | 27 | 27 | 25.5 | 30.5 | 27 |
| Content of boron nitride aggregate particles (second kind) (vol %) |  |  | 27 | 27 | 25.5 | 30.5 | 27 |
| K value (N/mm²) | Boron nitride aggregate particles (first kind) | 10% K value | 81 | 74 | 81 | 81 | 74 |
|  |  | 20% K value | 34 | 50 | 34 | 34 | 50 |
|  |  | 30% K value | 21 | 36 | 21 | 21 | 36 |
|  | Boron nitride aggregate particles (second kind) | 10% K value | 22 | 18 | 13 | 13 | 13 |
|  |  | 20% K value | 30 | 35 | 31 | 31 | 31 |
|  |  | 30% K value | 34 | 51 | 44 | 44 | 44 |

TABLE 1-continued

| | | | | | | |
|---|---|---|---|---|---|---|
| Particle diameter (μm) | Boron nitride aggregate particles (first kind) | 120 | 60 | 120 | 120 | 60 |
| | Boron nitride aggregate particles (second kind) | 25 | 55 | 40 | 40 | 40 |
| Mean major axis (μm) | Primary particles constituting boron nitride aggregate particles (first kind) | 7.9 | 7.3 | 7.9 | 7.9 | 7.3 |
| | Primary particles constituting boron nitride aggregate particles (second kind) | 6.3 | 9 | 7.2 | 7.2 | 7.2 |
| Aspect ratio | Primary particles constituting boron nitride aggregate particles (first kind) | 12 | 13 | 12 | 12 | 13 |
| | Primary particles constituting boron nitride aggregate particles (second kind) | 14 | 5.5 | 5.3 | 5.3 | 5.3 |
| Evaluation | (1) Coefficient of thermal conductivity | 1.21 | 1.45 | 1.30 | 1.54 | 1.52 |
| | (2) Dielectric breakdown strength | ○ | ○ | ○ | ○ | ○ |
| | (3) Variation in dielectric breakdown strength | ○ | Δ | ○ | ○ | ○ |
| | (4) Adhesion (peeling strength) | ○ | ○ | ○○ | ○ | ○ |

\* Not corresponding to first boron nitride aggregate particles or second boron nitride aggregate particles

TABLE 2

| | | | Comparative Example 1 | Comparative Example 2 | Comparative Example 3 | Comparative Example 4 | Comparative Example 5 |
|---|---|---|---|---|---|---|---|
| Composition of resin material (wt %) | Heat-curable compound | EPIKOTE 828US DL-92 | 28.5 | 28.5 | 28.5 | 28.5 | 28.5 |
| | Heat curing agent | Dicyandiamide | 1.0 | 1.0 | 1.0 | 1.0 | 1.0 |
| | | 2MZA-PW | 0.55 | 0.55 | 0.55 | 0.55 | 0.55 |
| | Boron nitride aggregate particles (first kind) (first boron nitride aggregate particles or alternative thereof) | PTX60S | 42 | | | | |
| | | PT350 | | | | | |
| | | AC6091 | | | | | |
| | | UHP-G1F | | 42* | 35* | | |
| | Boron nitride aggregate particles (second kind) (second boron nitride aggregate particles or alternative thereof) | Boron nitride aggregate particles 1 | | 28 | | 70 | |
| | | Boron nitride aggregate particles 2 | | | | | |
| | | Boron nitride aggregate particles 3 | | | | | |
| | | Boron nitride aggregate particles 4 | | | | | |
| | | AC6091 | 28* | | 35* | | 70* |
| Total content of boron nitride aggregate particles (vol %) | | | 54 | 54 | 54 | 54 | 54 |
| Content of boron nitride aggregate particles (first kind) (vol %) | | | 32 | 32 | 27 | — | — |
| Content of boron nitride aggregate particles (second kind) (vol %) | | | 22 | 22 | 27 | 54 | 54 |
| K value (N/mm$^2$) | Boron nitride aggregate particles (first kind) | 10% K value | 74 | 40 | 40 | — | — |
| | | 20% K value | 50 | 43 | 43 | — | — |
| | | 30% K value | 36 | 39 | 39 | — | — |
| | Boron nitride aggregate particles (second kind) | 10% K value | 174 | 13 | 174 | 13 | 174 |
| | | 20% K value | 110 | 31 | 110 | 31 | 110 |
| | | 30% K value | 63 | 44 | 63 | 44 | 63 |
| Particle diameter (μm) | Boron nitride aggregate particles (first kind) | | 60 | 70 | 70 | — | — |
| | Boron nitride aggregate particles (second kind) | | 100 | 40 | 100 | 40 | 100 |
| Mean major axis (μm) | Primary particles constituting boron nitride aggregate particles (first kind) | | 7.3 | 8.1 | 8.1 | — | — |
| | Primary particles constituting boron nitride aggregate particles (second kind) | | 17 | 7.2 | 17 | 7.2 | 17 |
| Aspect ratio | Primary particles constituting boron nitride aggregate particles (first kind) | | 13 | 10 | 10 | — | — |
| | Primary particles constituting boron nitride aggregate particles (second kind) | | 6.3 | 5.3 | 6.3 | 5.3 | 6.3 |
| Evaluation | (1) Coefficient of thermal conductivity | | 1.00 | 0.98 | 0.95 | 0.92 | 0.81 |
| | (2) Dielectric breakdown strength | | ○ | ○ | ○ | ○ | ○ |
| | (3) Variation in dielectric breakdown strength | | Δ | ○ | Δ | ○ | ○ |
| | (4) Adhesion (peeling strength) | | Δ | Δ | ○ | ○ | ○ |

\*Not corresponding to first boron nitride aggregate particles or second boron nitride aggregate particles

EXPLANATION OF SYMBOLS

1: Resin sheet (resin material)
11: Binder resin
12: First boron nitride aggregate particles
13: Second boron nitride aggregate particles
14: Cured product part (part where binder resin is cured)
21: Laminate
22: Thermal conductor
22a: One face (first face)
22b: Other face (second face)
23: Insulating layer
23a: One face (first face)
23b: Other face (second face)
24: Conductive layer
24a: One face (first face)
24b: Other face (second face)

The invention claimed is:

1. A resin material comprising:
   first boron nitride aggregate particles;
   second boron nitride aggregate particles; and
   a binder resin,
   a 10% K value of the second boron nitride aggregate particles being smaller than a 30% K value of the second boron nitride aggregate particles, and
   the 30% K value of the second boron nitride aggregate particles being smaller than a 10% K value of the first boron nitride aggregate particles.

2. The resin material according to claim 1, wherein a 30% K value of the first boron nitride aggregate particles is smaller than the 10% K value of the first boron nitride aggregate particles.

3. The resin material according to claim 1, wherein the 10% K value of the first boron nitride aggregate particles is 50 N/mm² or more.

4. The resin material according to claim 1, wherein primary particles constituting the second boron nitride aggregate particles have an aspect ratio of 9 or less.

5. The resin material according to claim 1, wherein
   the first boron nitride aggregate particles have a particle diameter of more than 20 μm,
   primary particles constituting the first boron nitride aggregate particles have a mean major axis of 2 μm or more and less than 20 m, and
   primary particles constituting the second boron nitride aggregate particles have a mean major axis of 8 μm or less.

6. The resin material according to claim 1, wherein the second boron nitride aggregate particles have a particle diameter of 30 μm or more and 60 μm or less.

7. The resin material according to claim 1, wherein in 100 vol % of the resin material, a total content of the first boron nitride aggregate particles and the second boron nitride aggregate particles is 20 vol % or more and 80 vol % or less.

8. The resin material according to claim 1, wherein the resin material is a resin sheet.

9. A laminate comprising:
   a thermal conductor;
   an insulating layer laminated on one face of the thermal conductor; and
   a conductive layer laminated on a face opposite to the thermal conductor of the insulating layer,
   the insulating layer being formed of the resin material according to claim 1.

10. The resin material according to claim 1, wherein the binder contains a heat-curable compound.

11. The resin material according to claim 10, wherein the heat-curable compound is an epoxy compound.

12. The resin material according to claim 1, wherein primary particles constituting the second boron nitride aggregate particles have a mean major axis of 7.5 μm or less.

13. The resin material according to claim 1, wherein primary particles constituting the second boron nitride aggregate particles have a mean major axis of 7.2 μm or less.

* * * * *